US005834848A

United States Patent [19]

Iwasaki

[11] Patent Number: 5,834,848

[45] Date of Patent: Nov. 10, 1998

[54] ELECTRONIC DEVICE AND SEMICONDUCTOR PACKAGE

[75] Inventor: Ken Iwasaki, Yokohama, Japan

[73] Assignee: Kabushiki Kaisha Toshiba, Kanagawa-ken, Japan

[21] Appl. No.: 982,417

[22] Filed: Dec. 2, 1997

[30] Foreign Application Priority Data

Dec. 3, 1996 [JP] Japan .................................... 8-323169

[51] Int. Cl.[6] ........................... H01L 23/48; H01L 23/52; H01L 29/40

[52] U.S. Cl. ............................................ 257/778; 257/780

[58] Field of Search .................................... 257/778, 780, 257/781, 777, 779, 686, 782, 697

[56] References Cited

U.S. PATENT DOCUMENTS 5,473,512 12/1995 Degani et al. .......................... 257/778
5,640,051 6/1997 Tomura et al. ......................... 257/778
5,729,440 3/1998 Jimarez et al. ......................... 257/778
5,731,630 3/1998 Suyama et al. ......................... 257/778

*Primary Examiner*—Mahshid D. Saadat
*Assistant Examiner*—S. V. Clark
*Attorney, Agent, or Firm*—Finnegan, Henderson, Farabow, Garrett & Dunner, L.L.P.

[57] ABSTRACT

The electronic device has a structure that a semiconductor package (10) is mounted on a motherboard (21), and a buffer layer (41) for relieving a stress, which is produced due to a difference of physical properties between the semiconductor package (10) and the motherboard (21), is mounted on the electrical and mechanical interface between the semiconductor package (10) and the motherboard (21). For example, the buffer layer (41) having a thermal expansion coefficient close to that of the motherboard (21) is formed on a face of the semiconductor package 10 having an external connecting terminals (12*b*) mounted. A stress caused due to a difference between a thermal expansion coefficient of a wiring substrate (12) of the semiconductor package and that of the motherboard (21) can be relieved by the buffer layer (41). Therefore, a cyclic stress applied to the connection between the semiconductor package and the motherboard in the actual application environment can be relieved, and reliability of connection can be improved. Thus, a semiconductor package mountable with a high degree of reliability and an electronic device having a high degree of reliability is provided.

20 Claims, 6 Drawing Sheets

11a 11 11a 14 13 10 12b 12a 12b 12a 12b 41 41 21 31 21a 21a 41 21a 31

ELECTRONIC DEVICE AND SEMICONDUCTOR PACKAGE

BACKGROUND OF THE INVENTION

1. Field of the Invention

The invention relates to an electronic device having a semiconductor package mounted on a motherboard or the like, and more particularly to an electronic device having a highly reliable structure.

The invention also relates to a semiconductor package having a highly reliable structure even when it is mounted on a motherboard or the like. The invention also relates to a semiconductor package configured to have high productivity when it is mounted on a motherboard or the like.

2. Description of the Related Art

With electronic equipment being made lightweight and compact in size, it has been demanded to mount various types of electronic parts on a wiring substrate and the like in high density. To mount the various electronic parts in high density, for example, a semiconductor package is required to be made smaller and thinner in size and also connected with high reliability. Specifically, to provide a compact and high-performance electronic device which has electronic parts such as a semiconductor package mounted on a wiring substrate as the host, it is necessary that the electronic parts such as the semiconductor package are made highly functional, compact and thin; the wiring substrate, on which the electronic parts are mounted, is made to have an improved wiring density; and electrical and mechanical connection between the electronic parts and the wiring substrate is improved in reliability.

Especially, since fine connecting terminals mounted in high density such electronic parts are connected on many points, high reliability must be secured over a range from the mounting process to the actual use of the product. Otherwise, stable performance cannot be obtained over a long period.

For example, a high thermal load is applied in a process of mounting the electronic parts on the wiring substrate by soldering or the like. In addition, a cyclic thermal load is also applied when an electronic part which has the electronic parts mounted on the wiring substrate is mounted. Therefore, a stress (mechanical stress) due to such a thermal load is applied to the interior of the electronic parts and the wiring substrate and also to the connections between the electronic parts and the wiring substrate. Conventionally, such a stress is the cause of degrading the reliability of the electronic device, and the electronic device has lost its functions as a result.

Now, a conventional semiconductor package will be described briefly.

FIG. 9 is a diagram schematically showing the structure of a conventional semiconductor package. This semiconductor package 90*a* has a semiconductor element 91 mounted with a face down on a wiring substrate 92.

This semiconductor package 90*a* has electrodes 91*a* of the semiconductor element 91 and connecting pads 92*a* mounted on a face of the wiring substrate 92, which has the semiconductor element 91 mounted. Conductive bumps 93 are intervened between the electrodes 91*a* and the connecting pads 92*a*. In addition, an encapsulant (sealing resin) 94 is formed in a gap between the semiconductor element 91 and the wiring substrate 92 to protect the connection between them. Connecting pads 92*b* are mounted on a face of the wiring substrate 92 opposite from its face on which the semiconductor element 91 is mounted, as external connecting terminals to connect the semiconductor package with an external circuit. The connecting pads 92*b* are mounted to have, for example, a grid shape on the wiring substrate 92, to configure a so-called LGA (Land Grid Array) type semiconductor package. In addition, mounting of solder balls or the like on the connecting pads 92*b* makes a BGA (Ball Grid Array) type semiconductor package. The connecting pads 92*a* and the connecting pads 92*b* are mutually connected with a wiring pattern formed on the wiring substrate intervened between them.

In the semiconductor package shown in FIG. 9, the wiring substrate 92 is an alumina substrate having alumina or other ceramics layer as an insulating layer and has a thickness of about 0.5 to about 0.7 mm and a square with each side of about 13 to about 40 mm. Further, the semiconductor element 91 has a square with each side of about 8 mm to about 15 mm.

FIG. 10 is a diagram schematically showing another embodiment of the structure of a conventional semiconductor package, which has the semiconductor element 91 mounted with a face up on the wiring substrate 92.

This semiconductor package has electrodes 91*a* of the semiconductor element 91 and connecting pads 92*a* mounted on a face of the wiring substrate 92 having the semiconductor element 91 mounted connected by bonding wires 96. The semiconductor element 91 is fixed to the wiring substrate 92 with an adhesive agent 95 or the like. In addition, the semiconductor element 91 is sealed with a molding resin 97. On a face of the wiring substrate 92 opposite from the side on which the semiconductor element 91 is mounted, the connecting pads 92*b* are mounted as the external connecting terminals in the same way as described above to connect the semiconductor package with an external circuit.

In the semiconductor package shown in FIG. 10, the wiring substrate 92 is also an alumina substrate having alumina composite as an insulating layer and has a thickness of about 0.5 to about 0.7 mm and a square with each side of about 13 to about 40 mm. Further, the semiconductor element 91 has a square with each side of about 8 mm to about 15 mm.

The semiconductor packages shown in FIG. 9 and FIG. 10 were described with reference to the wiring substrate 92 having alumina composite as the insulating layer. But, the insulating layer configuring the wiring substrate may also be formed of various types of insulating materials including ceramics such as aluminum nitride and polymers such as glass epoxy or BT resin.

The semiconductor package described above is then mounted on a wiring substrate (motherboard) of the host to configure an electronic device.

In addition, FIG. 11 is a diagram schematically showing a structure of the electronic device having the semiconductor package on the wiring substrate. The structure of an electronic device having the semiconductor package 90*a* shown in FIG. 9 mounted will be described.

For example, the connecting pads 101*a* mounted as a part of the wiring layer are mounted on a face of a wiring substrate 101 which has a laminated structure of an insulating layer of a glass epoxy resin and a wiring layer of copper or the like. The connecting pads 101*a* are mounted to face with the connecting pads 92*b,* which are the external connecting terminals of the semiconductor package 90*a*. In addition, the connecting pads 101*a* of the wiring substrate 101 and the connecting pads 92*b* of the semiconductor package are connected with the solder balls 103 intervened between them.

The semiconductor package 90*a* is mounted on the wiring substrate 101 by the following process, for example. First, the solder balls 103 are mounted on the connecting pads 92*b* of the semiconductor package 90*a* to make a BGA type semiconductor package. A solder paste is previously printed on the connecting pads 101*a* of the wiring substrate 101. In addition, the solder balls 103 and the connecting pads 101*a* of the wiring substrate 101 are aligned, and the solder balls 103 and the solder pastes are reflowed to electrically and mechanically connect the semiconductor package 90*a* with the wiring substrate 101. The amount of solder (or height of the solder balls 103) of the solder balls 103 is determined based on the size of the connecting terminals 101*a* and the weight of the semiconductor package 90*a*.

But, the electronic device described above has the following disadvantages.

For example, in the electronic device shown in FIG. 10, the wiring substrate configuring the semiconductor package 90*a* has the alumina insulating layer, and the wiring substrate 101 on the host has the insulating layer of the polymer of glass epoxy resin. If this electronic device has its components made of a different material, the physical property values such as a thermal expansion coefficient are also different.

For example, the wiring substrate having the alumina ($Al_2O_3$) insulating layer has a linear expansion coefficient of about $7\times10^{-6}$ to about $8\times10^{-6}$/K.

On the other hand, the wiring substrate, which has the insulating layer made of a cured prepreg having a glass cloth impregnated with glass epoxy resin, has a linear expansion coefficient of about $13\times10^{-6}$ to about $18\times10^{-6}$/K.

In addition, due to a thermal load or the like applied during mounting or in the actual application environment, a stress is applied to the connection between the semiconductor package 90*a* and the wiring substrate 101 to cause a fatigue failure (breakage) in the connection between the semiconductor package 90*a* and the wiring substrate 101. The inventors made it certain that due to a cyclic temperature change which is applied in the environment that the electronic device is used, a stress is repeatedly applied to the solder balls 103 which electrically and mechanically connect the connecting pads 92*b* with the connecting pads 101*a,* indicating a fatigue failure.

The electronic device shown in FIG. 10 was undergone a temperature cycle test (0° to 125° C.), and its service life was estimated to be about 300 to 600 cycles though variable depending on the size and shape of the semiconductor element 91, the wiring substrate 92, the wiring substrate 101 and the solder balls 103. Durability against the test is generally required to be about 1000 cycles in view of practical use.

Meanwhile, the semiconductor package, which had the wiring substrate 92 configured to have the glass epoxy resin as the insulating layer in the same manner as the wiring substrate 101, was undergone the temperature cycle test (0° to 125° C.). Its service life was about 1500 to 2000 cycles.

If the electronic parts can be produced by selecting the respective parts so to have conforming physical property values to configure the electronic parts, durability against the thermal load cyclically applied can be improved. But, in practice, a plurality of materials having a different physical property are generally used in combination to deal with the specifications required for respective parts, product costs and productivity.

The tendency of a fatigue failure occurring on the connection of the above-described solder balls or the like may increase as the semiconductor package is made to have high performance and high capacity, namely the semiconductor element 91 or the semiconductor package is made large (density is increased, and the size is made large). This is because displacement by deformation due to a stress increases as the size as the whole is made large. Therefore, the conventional semiconductor package and electronic device hardly secure reliability for a long period.

The connection described above has a tendency to suffer from a fatigue failure in a semiconductor package configured without sealing by a resin and also in the electronic device having various types of semiconductor packages.

To deal with a fatigue failure in the connection, it is tried to relieve the stress caused due to a difference of values of physical properties by enlarging a loft of the connection, such as increasing a height of the solder balls 103. But, when the solder balls 103 have an increased height, a degree of relative displacement between the semiconductor package 90*a* and the wiring substrate 101 increases, tending in degrading durability because a warp on the periphery of the semiconductor package increases. Therefore, it is still hard to secure the reliability of the connection of the electronic device for a long period.

In addition, the solder balls are in a molten state in the reflow process, but there are drawbacks that it is hard to keep the semiconductor package flat with respect to the motherboard in this process, and productivity in the mounting process is lowered. When the solder balls are made higher, it becomes further difficult to keep the semiconductor package flat with respect to the motherboard.

The invention was achieved to remedy the disadvantages described above. Specifically, the invention aims to provide a highly reliable electronic device, and more particularly an electronic device having a highly reliable connection between a semiconductor package and a motherboard. Further, the invention also aims to provide a semiconductor package having a structure capable of improving reliability of the electronic device. The invention also aims to provide a semiconductor package having a highly producible structure.

SUMMARY OF THE INVENTION

To remedy the drawbacks described above, the present invention configures an electronic device and a semiconductor package as described below.

A first aspect of the invention relates to an electronic device which comprises: a first wiring substrate having a first face, the first face of the first wiring substrate having a first region and a second region, connecting terminals formed on the first region, and the first wiring substrate having a first thermal expansion coefficient; a semiconductor package, comprising a second wiring substrate having a first face and a second face, the first face of the second wiring substrate having a first region and a second region, the first connecting terminals in the first region which are faced with the connecting terminals of the first substrate, second connecting terminals formed on the second face which are connected with the first connecting terminals, and the second wiring substrate having a second thermal expansion coefficient, and at least one semiconductor chip mounted on the second face of the second wiring substrate, and the semiconductor chip having electrodes connected with the second connecting terminals; connecting means for connecting the connecting terminals of the first wiring substrate and the first connecting terminals of the second wiring substrate; and a buffer layer interposed between the second region of the first face of the first wiring substrate and the second region of the first face of the second wiring substrate, the buffer layer having a third thermal expansion coefficient which is in the range between the first thermal expansion coefficient and the second thermal expansion coefficient.

The second wiring substrate is a wiring substrate configuring the semiconductor package, and the first wiring substrate is a so-called motherboard, forming a host for the semiconductor package.

The third thermal expansion coefficient may be between the first thermal expansion coefficient and the second thermal expansion coefficient. For example, it may be made of a material having substantially the same thermal expansion coefficient as the first thermal expansion coefficient.

A gap between the first face of the first wiring substrate and the first face of the second wiring substrate may be equal to a thickness of the buffer layer.

The first wiring substrate comprises at least one wiring layer and at least one insulating layer made of resin, and the second wiring substrate may comprise at least a two-layered wiring layer and at least a single-layered insulating layer made of ceramics.

In addition, the connecting means may be conductive bumps such as solder bumps (including solder balls).

The buffer layer preferably has a shape so as to maintain a gap between the first face of the first wiring substrate and the first face of the second wiring substrate flat when the solder bumps are melted. By adopting this structure, even when the solder is melted in the solder reflow process, the semiconductor package can be maintained flat while keeping a predetermined gap with respect to the motherboard.

The buffer layer may be formed along diagonal lines of the second wiring substrate. The buffer layer is preferably formed to have a shape so that a stress buffering function works as uniform as possible on the second wiring substrate as a whole. In addition, it is preferable to form the buffer layer in an isotropic pattern on the second wiring substrate.

Further, the buffer layer may have a first buffer layer connected with the first wiring substrate and a second buffer layer connected with the second wiring substrate. In addition, a thermal expansion coefficient of the first buffer layer may be larger than a thermal expansion coefficient of the second buffer layer. By configuring as described above, a stress caused due to inconsistency of the configuring materials between the semiconductor package and the motherboard can be relieved more effectively.

The third thermal expansion coefficient is preferably determined in a range of, for example, about $0.5\times10^{-5}$/K to about $1.8\times10^{-5}$/K.

A second aspect of the invention relates to a semiconductor package, which comprises: a second wiring substrate having a first face and a second face, the first face of the second wiring substrate having a first region and a second region, the first connecting terminals in the first region, second connecting terminals formed on the second face which are connected with the first connecting terminals, and the second wiring substrate having a second thermal expansion coefficient; at least one semiconductor chip mounted on the second face of the second wiring substrate, and the semiconductor chip having electrodes connected with the second connecting terminals; solder bumps formed on the first connecting terminal of the second substrate; and a buffer layer formed on the second region of the first face of the second wiring substrate, the buffer layer having a thickness which is approximately the same with a height of the solder bumps.

As described above, the buffer layer may be formed along diagonal lines of the second wiring substrate. The buffer layer is preferably shaped so that a stress buffering function is applied as uniform as possible to the whole second wiring substrate. And it is preferably formed in an isotropic pattern on the second wiring substrate. For example, the second region may be formed along diagonal lines of the second wiring substrate.

A third aspect of the invention relates to a semiconductor package, which comprises: a second wiring substrate having a first face and a second face, the first face of the second wiring substrate having a first region and a second region, the first connecting terminals in the first region, second connecting terminals formed on the second face which are connected with the first connecting terminals, and the second wiring substrate having a second thermal expansion coefficient; at least one semiconductor chip mounted on the second face of the second wiring substrate, and the semiconductor chip having electrodes connected with the second connecting terminals; and a buffer layer formed on the second region of the first face of the second wiring substrate, the buffer layer having a third thermal expansion coefficient which is larger than the second thermal expansion coefficient.

In addition, the wiring substrate may have at least a two-layered wiring layer and at least a single-layered insulating layer of ceramics. And the third thermal expansion coefficient may be determined in a range of about $0.5\times10^{-5}$/K to about $1.8\times10^{-5}$/K.

Additional conductive bumps may be formed on the first connecting terminals. For example, solder bumps (including solder balls) may be used as the conductive bumps.

The thickness of the buffer layer may be determined according to the size of the semiconductor package and a difference of the values of physical properties of the configuring materials between the semiconductor package and the motherboard. For example, the thickness of the buffer layer may be larger than the height of the solder bumps. By configuring as described above, even when the solder is melted and deformed, the positional relationship between the semiconductor package and the motherboard is stably maintained by the buffer layer, and highly reliable connection can be achieved. Furthermore, the solder bumps are deformed to expand in the direction of a normal line of the wiring substrate, so that a short circuit between the neighboring solder bumps can be prevented. Therefore, connection with high productivity can be performed even when the connecting terminals are mounted in a small pitch.

Further, the buffer layer may be formed along diagonal lines of the second wiring substrate.

The buffer layer may have the first buffer layer and the second buffer layer which is connected with the second wiring substrate, and the thermal expansion coefficient of the first buffer layer may be larger than that of the second buffer layer.

Besides, the semiconductor package may have a wiring substrate having external connecting terminals on one main face, a semiconductor element which is mounted on another main face of the wiring substrate and electrically connected to face with the external connecting terminals, and a buffer layer of the wiring substrate integrally mounted on one main face of the wiring substrate but insulated from the external connecting terminals.

In addition, the connection of the semiconductor element to the wiring substrate may be sealed by a resin layer.

The buffer layer may be formed along diagonal lines of the wiring substrate.

The respective buffer layers maybe made of a material having a thermal expansion coefficient falling between the thermal expansion coefficient of the wiring substrate and that of the motherboard.

The buffer layer may be formed integrally along diagonal lines of a square wiring substrate.

The buffer layer of the wiring substrate may be formed integrally, insulated from the external connecting terminals, on the wiring substrate on which the external connecting terminals of the semiconductor package are mounted. In addition, by integrally forming the buffer layer, the thermal expansion of the wiring substrate is relatively relieved and a stress applied to the external connecting terminals is suppressed, so that a fatigue failure in the connection can be prevented from occurring.

When the electronic device has the semiconductor package mounted on the motherboard through the connecting means such as the solder balls and the semiconductor package has the external connecting terminals introduced and mounted on a face opposite from the face having the semiconductor element mounted, the buffer layer, which is made of a material having a thermal expansion coefficient close to the thermal expansion coefficient of the motherboard or the thermal expansion coefficient of the wiring substrate of the semiconductor package, may be formed integrally on at least one of the wiring substrate and the motherboard of the semiconductor package.

In addition, the buffer layer is integrally formed on the wiring substrate of the semiconductor package, so that the expansion of the wiring substrate of the semiconductor package or the motherboard is relatively relieved (e.g., the wiring substrate of the semiconductor package becomes easy to expand). Further, a stress applied to the electrical and mechanical connection between the semiconductor package and the motherboard by the solder balls or the like can be relieved. Therefore, a fatigue failure in the connection can also be prevented, and reliability of the electronic device against a thermal load can be improved.

In the semiconductor package and the electronic device of the invention, the wiring substrate, on which the semiconductor element is mounted in the semiconductor package and the motherboard as the host on which the semiconductor package is mounted, can be a wiring substrate having as the insulating layer ceramics such as alumina or aluminum nitride and various types of resins such as glass epoxy resin or BT resin. Such a wiring substrate generally has a thickness of about 0.5 to about 2 mm.

In addition, the semiconductor element which configures the semiconductor package includes elements such as CPU, DSP and various types of memories, which are not particularly specified if they a chip type. The number of semiconductor element mounted on one semiconductor package may be multiple (e.g., a multi-chip module (MCM)). Further, another passive element such as an impedance and a capacitance may be mounted together with the semiconductor element. The substrates described above generally are rectangular such as square or oblong.

The resin layer for sealing and molding the semiconductor element on the wiring substrate of the semiconductor package may be any type of resins which are generally used to seal the semiconductor element. Specifically, any resins can be used if they can protect the semiconductor element from the moisture and impurities in the external environment and protect the semiconductor device mechanically. For example, a sealing epoxy resin-based composition having, as a filler, silica power which was purified with Na (sodium) and other components removed contained in the purified epoxy resin or polysulfonic resin can be used to form the molding resin layer.

In the semiconductor package of the invention, the buffer layer is electrically insulated from the external contacting terminals and disposed on the face of the wiring substrate mounting the semiconductor element, on which the external contacting terminals are mounted. In addition, the material configuring the buffer layer may be selected according to the material of the wiring substrate of the semiconductor package and the material of the motherboard on which the semiconductor package is mounted.

For example, where the semiconductor package is made of a wiring substrate (a linear expansion coefficient=7 to $8\times10^{-6}$/K) having alumina composite as the insulating layer and this semiconductor package is mounted on a motherboard (a linear expansion coefficient=13 to $18\times10^{-6}$/K) having a glass epoxy resin as the insulating layer, a material having a linear expansion coefficient close to that of the motherboard, e.g., copper or aluminum (a linear expansion coefficient=about $18\times10^{-6}$/K) may be used as the buffer layer. The thermal expansion coefficient of the buffer layer is preferably close to that of the motherboard, but an effect of relieving a stress can be obtained when it has a thermal expansion coefficient falling between the thermal expansion coefficient of the wiring substrate of the semiconductor package and that of the motherboard.

In addition, when the semiconductor package is configured of a wiring substrate (a linear expansion coefficient=4 to $5\times10^{-6}$/K) having aluminum nitride for the insulating layer and mounted on a motherboard (a linear expansion coefficient=14 to $15\times10^{-6}$/K) having a BT resin as the insulating layer, nickel (a linear expansion coefficient=$13\times10^{-6}$/K) having a linear expansion coefficient close to that of the motherboard may be used.

Besides, where the wiring substrate having aluminum nitride for the insulating layer is integrally bonded to the motherboard having the BT resin for the insulating layer, the wiring substrate of the semiconductor package is facilitated to expand while the motherboard is made hard to expand, so that a material, which has a thermal expansion coefficient falling between the thermal expansion coefficients of the wiring substrate and the motherboard, such as stainless steel (a linear expansion coefficient=about $11\times10^{-6}$/K), may be used.

This buffer layer may be mounted on the motherboard on which the semiconductor package is mounted in addition to the face of the semiconductor package on which the external connecting terminals are mounted.

In addition, the buffer layer for relieving the expansion described above is formed by, e.g., depositing or adhering metal foils (thin plate). Further, a metal layer may be formed as the buffer layer on the entire face of the wiring substrate and patterned. Besides, the buffer layer may be formed of not only an electric conductor but also an insulating material having an appropriate thermal expansion coefficient.

In the semiconductor package of the invention, a mounting form and mounting pitch of the external connecting terminals such as connecting pads to be formed on the wiring substrate on which the semiconductor element is mounted may be determined according to the functions and capacity of the semiconductor element mounted or the use of the semiconductor package. For example, it may be mounted in a grid pattern or a staggered pattern on the face opposite from the face of the wiring substrate on which the semiconductor element is mounted, or it may be formed in substantially a constant pitch on the periphery of the wiring substrate. In addition, the external connecting terminals may be mounted on a region of the wiring substrate excepting the region where the buffer layer is formed. The external connecting terminals are made of, e.g., gold, silver, nickel, aluminum, tin or solders and have conductive bumps made of solder or the like formed thereon.

The connection of the semiconductor package of the invention with the motherboard on the host side of the semiconductor package is not limited to be made by solder. Further, a solid phase diffusion bonding with conductive bumps may be adopted for example.

The solid phase diffusion bonding is achieved by applying ultrasonic waves while pressing the external connecting terminals of the semiconductor package and the connecting pads of the motherboard. The semiconductor package and the electronic device of the invention can prevent the conductive bumps from being cracked even if a load is fully applied because the gap between the semiconductor package and the motherboard is defined by the buffer layer. Besides, a uniform force can be applied regardless of the dispersion of the respective shapes of the conductive bumps or the mounting pattern on the semiconductor package. In this case, the external connecting terminals such as the conductive bumps are required to be determined higher than the thickness of the buffer layer.

By configuring as described above, a solid phase diffusive phase having a sufficiently high mechanical strength and a sufficiently low contacting resistance can be formed between the connecting pads of the motherboard and the conductive bumps of the semiconductor package.

This solid phase diffusion bonding is particularly effective to make the semiconductor package thin.

DESCRIPTION OF THE PREFERRED EMBODIMENTS

Preferred embodiments of the invention will be described.

(Embodiment 1)

Figure 1:
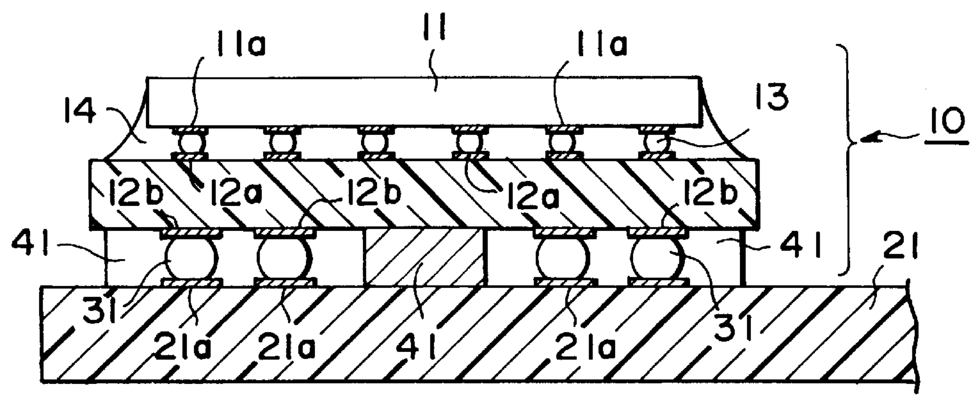
FIG. 1 is a sectional view schematically showing the structure of an electronic device of the invention.

FIG. 1 is a diagram schematically showing the structure of an electronic device of the invention, having a BGA type semiconductor package mounted on a motherboard.

This semiconductor package 10 has electrodes 11*a* and connecting pads 12*a* connected with conductive bumps 13 intervened between them. The electrodes 11*a* are formed on a semiconductor element 11, and the connecting pads 12*a* are formed on a face of a wiring substrate 12 where the semiconductor element 11 is mounted. An encapsulant (sealing resin) 14 is formed in a gap between the semiconductor element 11 and the wiring substrate 12 to protect the connection. Connecting pads 12*b* are mounted on a face of the wiring substrate 12 opposite from the face on which the semiconductor element 11 is mounted as external connecting terminals for connecting the semiconductor package with an external circuit. The connecting pads 12*b* are mounted in a pattern of, for example a grid, on the wiring substrate 12, and solder balls 31 are mounted on the connecting pads 12*b*. The connecting pads 12*a* and the connecting pads 12*b* are connected with each other with a wiring pattern formed on the wiring substrate intervened between them.

The wiring substrate 12 of the semiconductor package is an alumina substrate, which has alumina layer as an insulating layer and has a thickness of about 0.4 mm and an area of about 13×13 mm. Its thermal expansion coefficient is about 7 to $8\times10^{-6}$/K. And the semiconductor element 11 has a size of about 11×11 mm.

A motherboard 21, on which the semiconductor package 10 is mounted, has a laminated structure of an insulating layer made of, e.g., glass epoxy resin, and a wiring layer made of copper or the like. In addition, connecting pads 21*a* are mounted as a part of the wiring layer on the motherboard.

The motherboard 21 has a glass cloth as base material impregnated with an epoxy resin and its thermal expansion coefficient is about $18\times10^{-6}$/K. In addition, it has a thickness of about 0.4 mm and an area of about 13×13 mm.

The connecting pads 21*a* are mounted to face with the connecting pads 12*b,* which are the external connecting terminals of the semiconductor package 10. In addition, the connecting pads 21*a* of the motherboard 21 and the connecting pads 12*b* of the semiconductor package 10 are mutually connected with the solder balls 31 intervened between them.

The electronic device of the invention has a buffer layer 41 formed between the motherboard and the face of the semiconductor package 10 on which the external connecting terminals are formed. The buffer layer 41 relieves a stress caused due to a difference between a thermal expansion coefficient of the wiring substrate 12 of the semiconductor package 10 and that of the motherboard 21. The buffer layer 41 is fixed to both the semiconductor package 10 and the motherboard 21 with an adhesive agent or the like. This buffer layer 41 is also formed so to be insulated from the solder balls 31.

Figure 2:
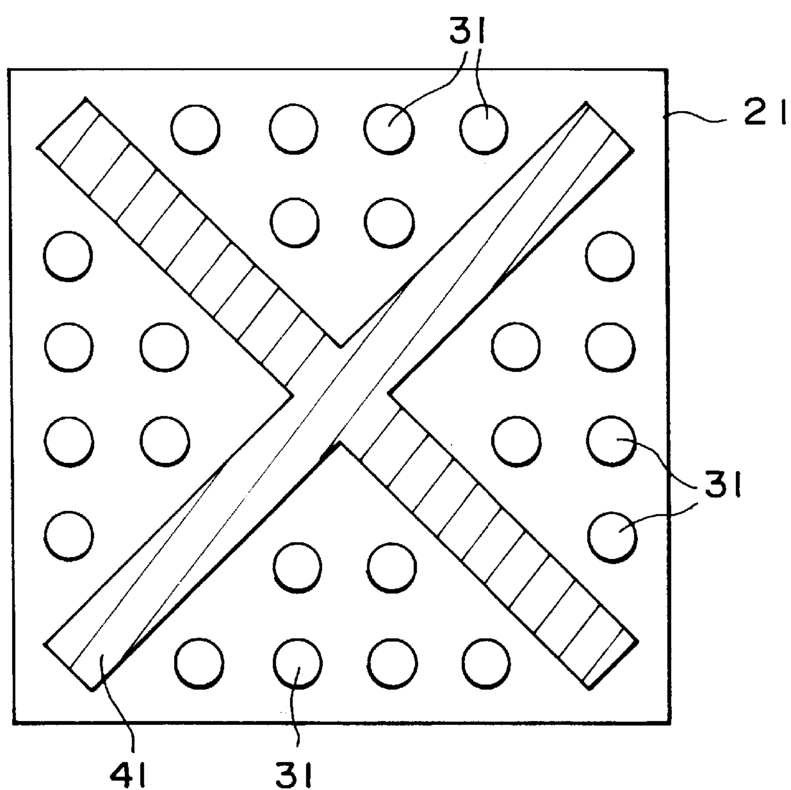
FIG. 2 is a diagram illustrating an arrangement of the buffer layer of a semiconductor package of the invention.

FIG. 2 is a diagram schematically showing the buffer layer mounted on the semiconductor package of the invention. The buffer layer 41 is made of a material having a thermal expansion coefficient close to that of the motherboard so that it is mounted on the wiring substrate with the expansion of the wiring substrate 12 of the semiconductor package 10 facilitated. For example, since the motherboard has a glass epoxy resin as the insulating layer, the buffer layer 41 is made of copper or aluminum material having a thermal expansion coefficient close to that of the motherboard and integrally mounted on a prescribed region (a second region) of a face of the wiring substrate 12 of the semiconductor package 10 on which the connecting pads 12*b* are also mounted.

The buffer layer 41 is extended along diagonal lines of the wiring substrate 12 from the center of the wiring substrate 12 to reach the neighborhood of four corners of the wiring substrate 12. Thus, a difference of thermal expansion coefficient between the wiring substrate 12 and the motherboard 21 can be relieved effectively.

The buffer layer 41 also serves to define a gap between the semiconductor package 10 and the motherboard 21. Specifically, where the solder balls 31 are reflowed to connect the connecting pads 12*b* with the connecting pads 21*a,* the gap between the semiconductor package 10 and the motherboard 21 can be kept uniform to a predetermined size. Therefore, the semiconductor package can be prevented from being inclined due to melting of the solder balls in the reflow process.

In addition, the buffer layer 41 may have a thickness (height) larger or smaller than the height of the solder balls 31 though variable depending on the size, mounting pitch or the like of the solder balls 31.

The semiconductor package 10 is mounted on the motherboard 21 as follows for example. The solder balls 31 are first mounted on the semiconductor package 10 which has the buffer layer 41 mounted thereon to prepare a BGA type semiconductor package. A solder paste is previously printed on the connecting pads 21*a* of the motherboard 21. The solder balls 31 are aligned with the connecting pads 21*a* of the motherboard 21, and the solder balls 31 and the solder paste are once melted to electrically and mechanically connect the semiconductor package 10 with the motherboard 21. At the time, the gap between the semiconductor package 10 and the motherboard 21 is kept uniform by the buffer layer 41 as described above. Besides, even when a loft of the buffer layer 41 is slightly larger than the height of the solder balls 31 mounted on the semiconductor package, the semiconductor package 10 and the motherboard 21 can be connected by melting and deforming. Since the buffer layer 41 also serves to control the height of the solder balls 31, the connecting solder can be prevented from losing the shape, and a possibility of a short circuit between the neighboring solder balls can be prevented.

In the embodiment described above, the solder balls 31 were used as the external connecting terminals of the semiconductor package, but conductive bumps may be mounted by printing and drying the solder paste. In addition, the solder balls 31 and the conductive bumps may be formed not on the semiconductor package but on the motherboard.

(Embodiment 2)

Figure 3:
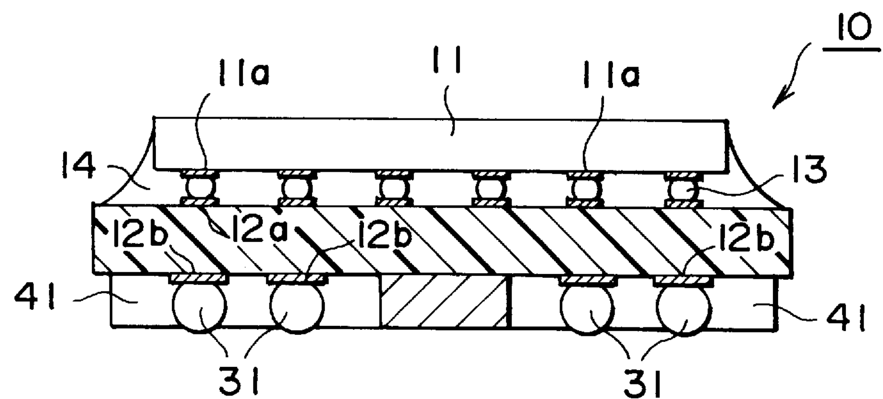
FIG. 3 is a schematic diagram showing the structure of a semiconductor package of the invention.

FIG. 3 is a diagram schematically showing the structure of a semiconductor package of the invention. This semiconductor package has the semiconductor element 11 mounted with a face down on the wiring substrate 12.

This semiconductor package has the electrodes 11*a* of the semiconductor element and the connecting pads 12*a* which are mounted on a face of the wiring substrate 12 having the semiconductor element 11 mounted thereon connected with the conductive bumps 13 intervened between them. Further, the encapsulant 14 is formed in a gap between the semiconductor element 11 and the wiring substrate 12 to protect the connection. The connecting pads 12*b* are mounted as external connecting terminals on a face of the wiring substrate 12 opposite from the face having the semiconductor element 11 mounted thereon, to connect the semiconductor package with an external circuit. The connecting pads 12*b* are mounted on the wiring substrate 12 in the pattern of, e.g., a grid. In addition, the solder balls 31 are mounted on the connecting pads 12*b* to configure a BGA (Ball Grid Array) type semiconductor package. The connecting pads 12*a* and the connecting pads 12*b* are connected with a wiring pattern formed on the wiring substrate intervened between them.

In the semiconductor package shown in FIG. 3, the wiring substrate 12 is an alumina substrate (a thermal expansion coefficient is about 7 to $8\times10^{-6}$/K) which has alumina layer as an insulating layer and has a thickness of about 0.5 mm to about 0.7 mm and a square with each side of about 13 to about 40 mm. And the semiconductor element 11 has a square with each side of about 8 mm to about 15 mm.

The semiconductor package of the invention has the buffer layer 41 formed on a second region of a face opposite from the face of the semiconductor package 10 having the semiconductor element 11 mounted thereon. When the wiring substrate configuring the semiconductor package has an insulating material such as ceramics, the buffer layer 41 has preferably a thermal expansion coefficient of about $0.5\times10^{-5}$/K to about $1.8\times10^{-5}$/K, and more preferably about $0.5\times10^{-5}$/K to about $1.3\times10^{-5}$/K.

In addition, it is suitably coordinated isotropically with respect to the wiring substrate 12 of the semiconductor package.

It is preferably mounted in the form of, for example, a cross shape so to reach the connecting pads which are formed at the center of the semiconductor package without crossing the buffer layer 41. Accordingly, flexibility of wiring on the motherboard and the wiring substrate of the semiconductor package can be improved.

In addition, the semiconductor package 10 is mounted on the wiring substrate (motherboard) on the host to configure the electronic device as shown in FIG. 1. The semiconductor package of the invention has the buffer layer 41 and can relieve a stress applied to the external connecting terminals such as the solder balls 31 which serve as the electrical and mechanical interface of the semiconductor package. In other words, the mechanically connecting part of the interface of the semiconductor package was made dual. Accordingly, the semiconductor package of the invention is improved in durability and reliability against a stress due to a thermal load cyclically applied in a practically used environment.

(Embodiment 3)

The inventors have confirmed that the electronic device of the invention having the semiconductor package of the invention prevents the connection (such as the solder balls) between the semiconductor package 10 and the motherboard 21 from being warped due to a temperature change in its practically used environments.

For example, the electronic device of the invention shown in FIG. 1 was produced and undergone a temperature cycle test (0° to 125° C.). It was found that the electronic device had highly reliable connection without suffering from a fatigue failure even after 1000 cycles.

(Embodiment 4)

Figure 4:
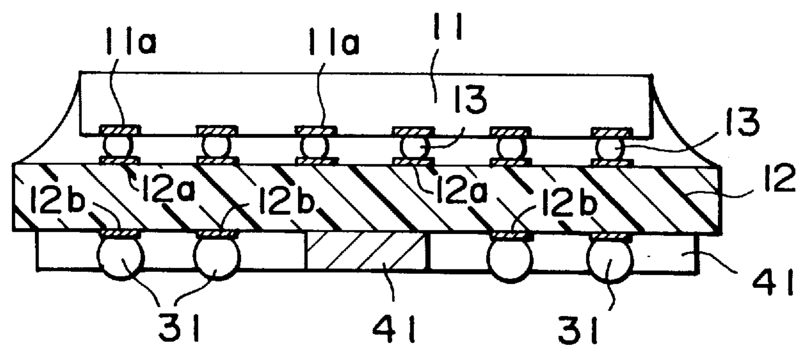
FIG. 4 is a schematic diagram showing the structure of a semiconductor package of the invention.

FIG. 4 is a diagram schematically showing the structure of a semiconductor package of the invention.

This semiconductor package has the electrodes 11*a* of the semiconductor element and the connecting pads 12*a* connected with the conductive bumps 13 intervened between them. The connecting pads 12*a* are formed on the face of the wiring substrate 12 where the semiconductor element 11 is mounted. The connecting pads 12*b* are mounted as external connecting terminals on a face of the wiring substrate 12 opposite from the face having the semiconductor element 11 mounted thereon, to connect the semiconductor package with an external circuit. The connecting pads 12$b$ are mounted on the wiring substrate 12 in the pattern of, e.g. a grid. Further, the solder balls 31 are mounted on the connecting pads 12$b$ to configure a BGA (Ball Grid Array) type semiconductor package. The connecting pads 12$a$ and the connecting pads 12$b$ are mutually connected with a wiring pattern formed on the wiring substrate intervened between them.

In the semiconductor package shown in FIG. 3, the wiring substrate 12 is an alumina substrate (a thermal expansion coefficient of about 7 to $8\times10^{-6}$/K) which has alumina as an insulating layer and has a thickness of about 0.4 mm, and an area of about 13×13 mm. And the semiconductor element 11 has a size of about 11×11 mm.

In addition, the semiconductor package of the invention has the buffer layer 41 formed on the second region of a face of the semiconductor package 10 opposite from the face having the semiconductor element 11 mounted thereon.

The encapsulant 14 is not formed between the semiconductor element 11 and the wiring substrate 12. The encapsulant 14 can be omitted because a stress applied to the semiconductor package is relieved by the buffer layer 41 and a stress applied to the connection between the semiconductor element 11 and the wiring substrate 12 in the semiconductor package can be lowered.

(Embodiment 5)

Figure 5:
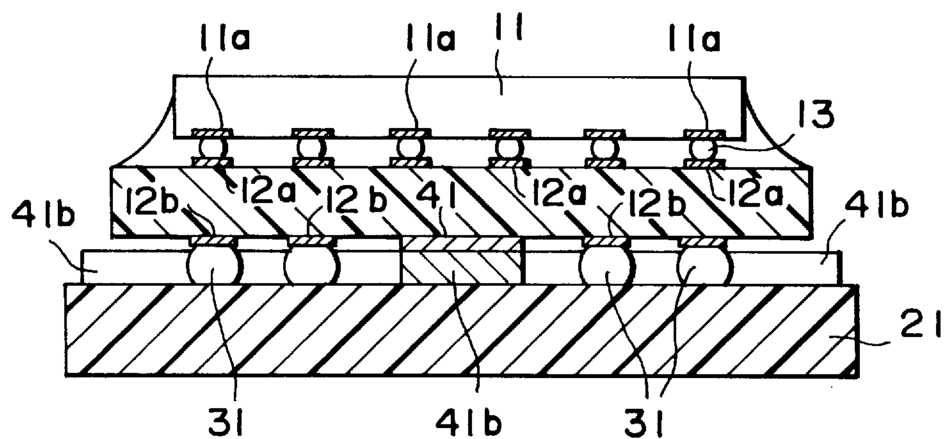
FIG. 5 is a schematic diagram showing the structure of an electronic device of the invention.

FIG. 5 is a diagram schematically showing another structure of the electronic device of the invention. The semiconductor package 10 for the electronic device is the same as the semiconductor package of the electronic device shown in FIG. 1 excepting the buffer layer 41 is omitted.

Instead of mounting the buffer layer 41 on the semiconductor package 10, a buffer layer 41$b$ made of stainless steel (a thermal expansion coefficient of $11\times10^{-6}$/K) electrically insulated from the external connecting terminals is integrally formed on the face of the wiring substrate 21 where the connecting pads 21$a$ are formed. The material for the motherboard 21 is the same as the electronic device shown in FIG. 1.

The electronic device configured as described above could suppress or prevent a warp from occurring in the soldering and connecting step due to a temperature change in the application process. For example, the electronic device of the invention was undergone a temperature cycle test (0° to 125° C.). It was found that the electronic device had highly reliable connections without suffering from a fatigue failure even after 1000 cycles.

(Embodiment 6)

Figure 6:
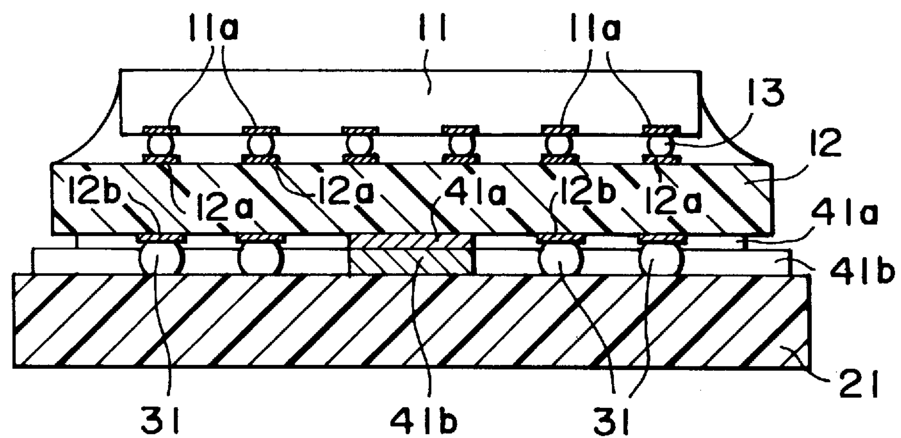
FIG. 6 is a schematic diagram showing the structure of an electronic device of the invention.

FIG. 6 is a diagram schematically showing another structure of the electronic device of the invention.

The electronic device has a buffer layer 41 made of copper formed on the wiring substrate 12 of the semiconductor package 10 and an expansion coefficient buffer layer 41$b$ made of a material having an expansion coefficient close to that of alumina on the motherboard 21. In this configuration, the same effects as described above were obtained. A total thickness of the buffer layer 41 formed on the wiring substrate 12 and the buffer layer 41$b$ formed on the motherboard 21 is determined to be close to the semiconductor package shown in FIG. 1.

(Embodiment 7)

Figure 7:
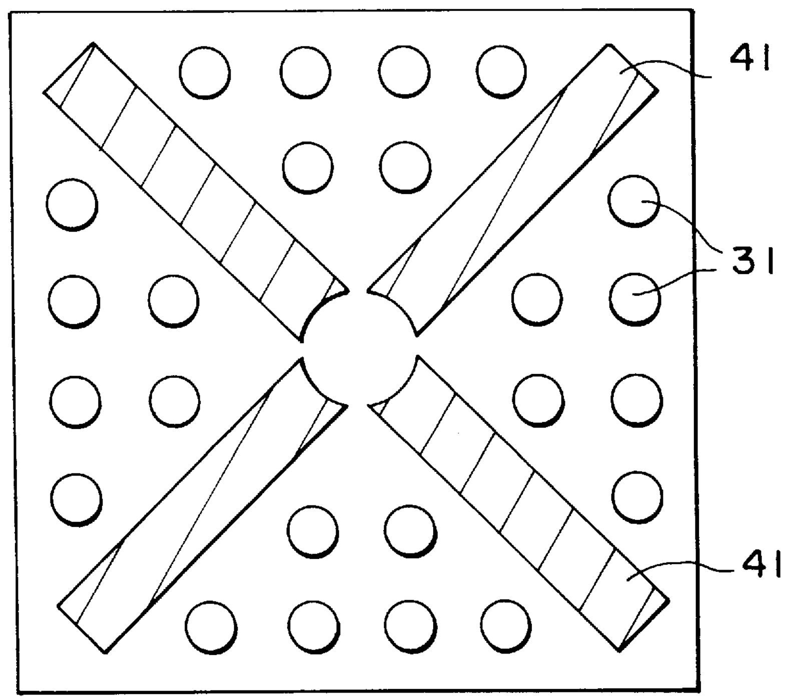
FIG. 7 is a diagram illustrating an arrangement of the buffer layer of a semiconductor package of the invention.

FIG. 7 is a diagram schematically showing another structure of the semiconductor package of the invention, illustrating the pattern of a buffer layer 41.

This semiconductor package has the buffer layer 41 formed on the face of the wiring substrate 12 which has the semiconductor element 11 mounted, so to extend along the diagonal lines to the neighborhood of corners. And the buffer layer 41 is separated at the center into four sections. It was found that this configuration was also effective in facilitating to extend the wiring substrate 12.

(Embodiment 8)

Figure 8A:
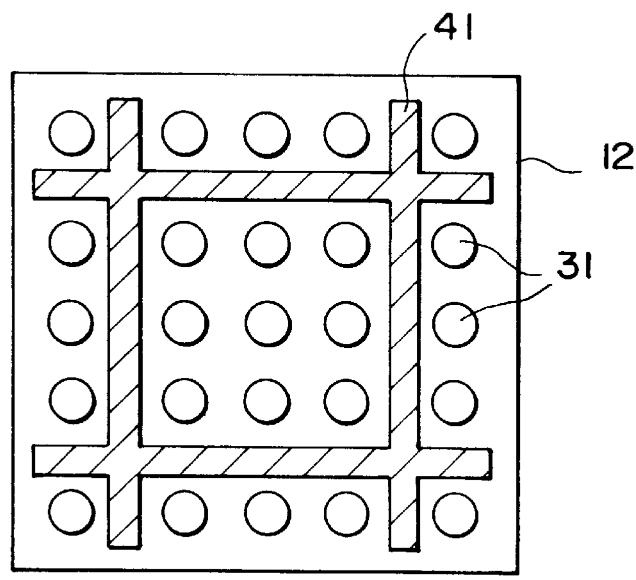
FIG. 8A and FIG. 8B are diagrams illustrating other arrangements of the buffer layer of a semiconductor package of the invention.
Figure 8B:
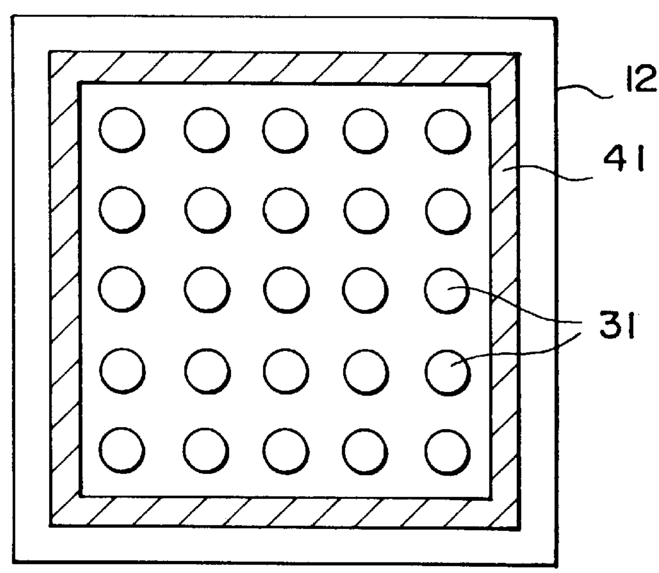
Figure 9:
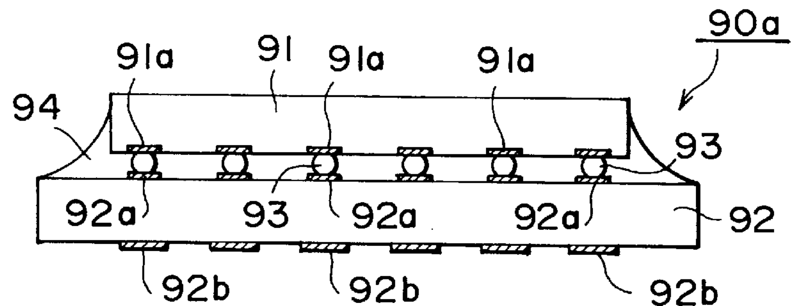
FIG. 9 and FIG. 10 are schematic diagrams showing the structures of conventional semiconductor packages.
Figure 10:
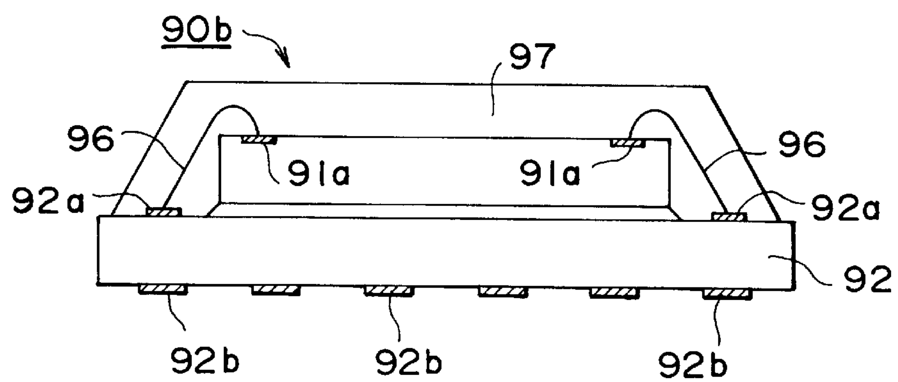
Figure 11:
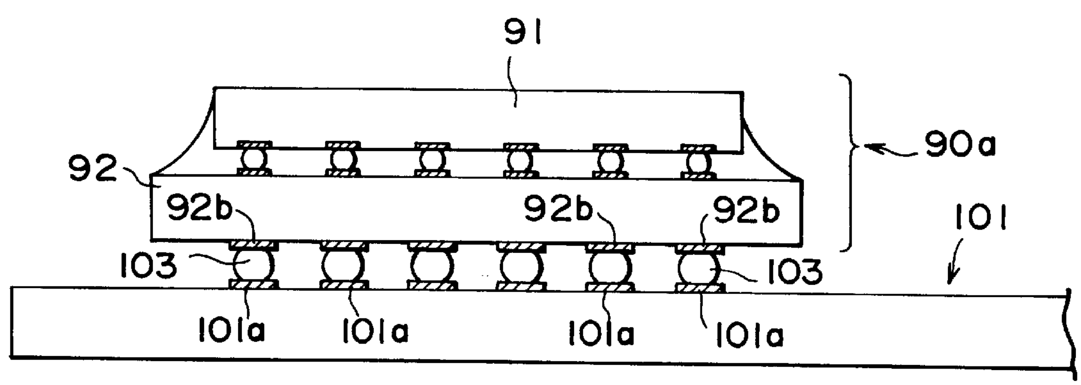
FIG. 11 is a schematic diagram showing the structure of a conventional electronic device.

FIG. 8A and FIG. 8B are diagrams schematically showing other structures of the semiconductor package of the invention.

The semiconductor package of FIG. 8A have the buffer layer 41 electrically insulated from the connecting pads 12$b$ and the solder balls 31 and mounted on the face of the wiring substrate 12 having the external connecting terminals mounted thereon mounted, to separate the external connecting terminals such as the solder balls 31 into the shape of a grid.

And FIG. 8B shows that the buffer layer 41 is integrally formed on the periphery of the wiring substrate 12 so to surround the external connecting terminals.

The above configuration relieves a stress caused due to inconsistency of physical properties between the semiconductor package 10 and the motherboard 21.

The invention is not limited to the embodiments described above and can be modified in various ways without departing from the spirit and scope of the invention. For example, the insulating layer of the wiring board of the semiconductor package and the insulating layer of the motherboard can be used as required.

As described above, the electronic device of the invention having the buffer layer mounted can relieve a stress caused due to inconsistency of physical properties between the semiconductor package and the motherboard having the semiconductor package thereon. Further, reliability of connection between the semiconductor package and the motherboard can be improved. In the actual application environment, a stress produced in the connection due to a thermal load applied cyclically can be relieved.

In the semiconductor package of the invention, even when the semiconductor package is mounted on the motherboard, a stress caused due to a difference between a thermal expansion coefficient of the motherboard and that of the wiring substrate of the semiconductor package can be relieved. Therefore, reliability of connection of the electronic device can be improved remarkably by using the semiconductor package of the invention. For example, the external connection terminals such as the solder balls and the conductive bumps can be prevented from being warped, a fatigue failure in the connection hardly occurs, and the semiconductor package which can be connected with a high degree of reliability can be provided.

What is claimed is:

1. An electronic device, comprising:

a first wiring substrate having a first face, the first face of the first wiring substrate having a first region and a second region, connecting terminals formed on the first region, and the first wiring substrate having a first thermal expansion coefficient;

a semiconductor package comprises, a second wiring substrate having a first face and a second face, the first face of the second wiring substrate having a first region and a second region, the first connecting terminals in the first region which are faced with the connecting terminals of the first substrate, second connecting terminals formed on the second face which are connected with the first connecting terminals, and the second wiring substrate having a second thermal expansion coefficient, and at least one semiconductor chip mounted on the second face of the second wiring substrate, and the semiconductor chip having electrodes connected with the second connecting terminals;

connecting means for connecting the connecting terminals of the first wiring substrate and the first connecting terminals of the second wiring substrate; and, a buffer layer interposed between the second region of the first face of the first wiring substrate and the second region of the first face of the second wiring substrate, the buffer layer having a third thermal expansion coefficient which is in the range between the first thermal expansion coefficient and the second thermal expansion coefficient.

2. An electronic device as set forth in claim 1, wherein the first thermal expansion coefficient and the third thermal expansion coefficient are approximately same.

3. An electronic device as set forth in claim 1, wherein a gap between the first face of the first wiring substrate and the first face of the second wiring substrate are equal to a thickness of the buffer layer.

4. An electronic device as set forth in claim 1, wherein the first wiring substrate comprising at least one wiring layer and at least one insulating layer insulating layer made of resin, and the second wiring substrate comprising a plurality of wiring layers and at least one insulating layer insulating layer made of ceramics.

5. An electronic device as set forth in claim 1, wherein the connecting means are solder bumps.

6. An electronic device as set forth in claim 5, wherein the buffer layer having a shape so as to maintain a gap between the first face of the first wiring substrate and the first face of the second wiring substrate flat when solder bumps are melted.

7. An electronic device as set forth in claim 1, wherein the buffer layer is formed along diagonal lines of the second wiring substrate.

8. An electronic device as set forth in claim 1, wherein the buffer layer having a lamination of a first buffer layer connected with the first wiring substrate and a second buffer layer connected with the second wiring substrate.

9. An electronic device as set forth in claim 8, wherein a thermal expansion coefficient of the first buffer layer is larger than a thermal expansion coefficient of the second buffer layer.

10. An electronic device as set forth in claim 1, wherein the third thermal expansion coefficient is in the range from about $0.5\times10^{-5}$ to about $1.8\times10^{-5}$.

11. A semiconductor package, comprising:

a wiring substrate having a first face and a second face, the first face of the second wiring substrate having a first region and a second region, the first connecting terminals in the first region, second connecting terminals formed on the second face which are connected with the first connecting terminals, and the second wiring substrate having a second thermal expansion coefficient;

at least one semiconductor chip mounted on the second face of the second wiring substrate, and the semiconductor chip having electrodes connected with the second connecting terminals;

solder bumps formed on the first connecting terminal of the second substrate; and, a buffer layer formed on the second region of the first face of the second wiring substrate, the buffer layer having a thickness which is approximately the same with a height of the solder bumps.

12. A semiconductor package as set forth in claim 11, wherein the buffer layer is formed along diagonal lines of the second wiring substrate.

13. A semiconductor package, comprising:

a wiring substrate having a first face and a second face, the first face of the second wiring substrate having a first region and a second region, the first connecting terminals in the first region, second connecting terminals formed on the second face which are connected with the first connecting terminals, and the second wiring substrate having a second thermal expansion coefficient;

at least one semiconductor chip mounted on the second face of the second wiring substrate, and the semiconductor chip having electrodes connected with the second connecting terminals; and, a buffer layer formed on the second region of the first face of the second wiring substrate, the buffer layer having a third thermal expansion coefficient which is larger than the second thermal expansion coefficient.

14. A semiconductor package as set forth in claim 13, wherein the second wiring substrate comprising a plurality of wiring layers and at least one insulating layer insulating layer made of ceramics.

15. A semiconductor package as set forth in claim 14, wherein the third thermal expansion coefficient is in the range from about $0.5\times10^{-5}$ to about $1.8\times10^{-5}$.

16. A semiconductor package as set forth in claim 13 further comprising conductive bumps formed on the second connecting terminals of the second wiring substrate.

17. A semiconductor package as set forth in claim 16, wherein the conductive bumps are solder bumps.

18. An electronic device as set forth in claim 16, wherein the thickness of the buffer layer is larger than the height of the solder bumps.

19. An electronic device as set forth in claim 13, wherein the second region is formed along diagonal lines of the second wiring substrate.

20. An electronic device as set forth in claim 13, wherein the buffer layer having a lamination of a first buffer layer and a second buffer layer connected with the second wiring substrate, and the thermal expansion coefficient of the first buffer layer is larger than a thermal expansion coefficient of the second buffer layer.

* * * * *

UNITED STATES PATENT AND TRADEMARK OFFICE

CERTIFICATE OF CORRECTION

PATENT NO. : 5,834,848

DATED : November 10, 1998

INVENTOR(S) : Iwasaki

It is certified that error appears in the above-indentified patent and that said Letters Patent is hereby corrected as shown below:

Title page, Item [57], in the Abstract, line 10, after "having" delete "an".

Claim 2, column 15, line 23, before "same" insert --the--.

Signed and Sealed this

Tenth Day of August, 1999

Attest:

Q. TODD DICKINSON

*Attesting Officer*

*Acting Commissioner of Patents and Trademarks*